United States Patent
Akeson et al.

(10) Patent No.: US 6,368,574 B1
(45) Date of Patent: Apr. 9, 2002

(54) CONTRAST AGENT-ENHANCED MAGNETIC RESONANCE IMAGING OF TISSUE PERFUSION

(75) Inventors: Per Akeson; Lars Johansson, both of Wayne, PA (US)

(73) Assignee: Amersham Health AS, Oslo (NO)

( * ) Notice: Subject to any disclaimer, the term of this patent is extended or adjusted under 35 U.S.C. 154(b) by 0 days.

(21) Appl. No.: 09/488,785

(22) Filed: Jan. 21, 2000

Related U.S. Application Data

(63) Continuation of application No. PCT/GB98/02281, filed on Jul. 30, 1998.
(60) Provisional application No. 60/055,654, filed on Aug. 14, 1997.

(30) Foreign Application Priority Data

Aug. 1, 1997 (GB) .............................................. 9716365

(51) Int. Cl.⁷ .............................................. A61B 5/055
(52) U.S. Cl. ................ 424/9.32; 424/9.323; 424/9.322; 424/9.3; 424/9.1
(58) Field of Search ................................ 424/1.11, 9.1, 424/9.3, 9.32, 9.322, 9.323

(56) References Cited

U.S. PATENT DOCUMENTS 6,123,920 A * 9/2000 Gunther et al. .......... 424/9.322

FOREIGN PATENT DOCUMENTS

WO          WO 97 25073 A          7/1997

OTHER PUBLICATIONS

Albert et al, 1993, Magnetic Resonance in Medicine, vol. 29, pp. 700–708.*
Chambon et al, 1993, Magnetic Resonance Imaging, vol. 11, pp. 509–519.*
Kuhl et al, Radiology, 1997, vol. 202, pp. 87–95.*
Grangier et al, 1994, Journal of Computer Assisted Tomograpy, vol. 18, No. 6, pp. 888–896.*

* cited by examiner

Primary Examiner—Dameron L. Jones
(74) Attorney, Agent, or Firm—Bacon & Thomas

(57) ABSTRACT

This invention relates to a method of contrast agent-enhanced magnetic resonance imaging of perfusion in vasculated tissue within a human or non-human animal body in which a bolus comprising a contrast-enhancing amount of a magnetic resonance imaging contrast agent is administered into the vascular system of said body, and said body is subjected to a magnetic resonance imaging procedure whereby signals or images representative of first pass of said contrast agent bolus through tissue of interest are generated, characterised in that (i) said contrast agent is capable of exhibiting simultaneous, determinable $T_1$ and $T_2^*$ reducing effects under the imaging procedure employed and (ii) a $T_1$-weighted imaging procedure is used (a) to visualise the first pass of said contrast agent bolus through said tissue by virtue of its signal lowering $T_2^*$ effect and (b) to obtain a $T_1$-weighted contrast agent-enhanced image of said tissue.

8 Claims, No Drawings

CONTRAST AGENT-ENHANCED MAGNETIC RESONANCE IMAGING OF TISSUE PERFUSION

This application is a continuation of pending international application number PCT/GB98/02281 filed Jul. 30, 1998 (of which the entire disclosure of the pending, prior application is hereby incorporated by reference), which itself is a continuation-in-part of U.S. provisional application No. 60/055,654 filed Aug. 14, 1997.

This invention relates to magnetic resonance imaging, more particularly to use of magnetic resonance imaging in measuring tissue perfusion.

Measurements of cardiac perfusion, in particular to evaluate blood supply to the myocardium, are of importance in assessing whether patients may be at risk owing to low perfusion and whether they may benefit from preventative methods and/or treatment. Such measurements are at present typically performed using radioisotopic imaging techniques such as scintigraphy, positron emission tomography or single photon emission computed tomography; these techniques all involve injection of radioactive substances, with potential safety risks for both patients and medical staff. There is accordingly ongoing interest in the development of techniques which are less invasive and avoid radiation exposure.

Perfusion measurements in respect of other organs including, but not limited to, the kidneys and of tumour tissue are also of clinical value, e.g. for diagnostic purposes.

The use of magnetic resonance (MR) imaging in perfusion studies has received considerable attention, particularly with the development of fast and ultrafast MR imaging techniques such as fast (or turbo) spin-echo imaging, gradient-echo imaging, fast gradient recalled echo imaging, echo-planar imaging and ultrafast gradient-echo imaging, which facilitate contrast agent-enhanced dynamic imaging.

Thus, for example, Nelson et al. in *Topics in Magnetic Resonance Imaging* 7(3), pp. 124–136 (1995) report use of first-pass dynamic contrast-enhanced imaging following bolus intravenous injection of MR contrast agents in assessment of cerebral perfusion. It is stated that first-pass studies rely on observation of combined $T_2$ and susceptibility effects (i.e. $T_2^*$ effects), so that cerebral perfusion correlates with a decrease in signal intensity. This effect may be observed using a $T_2^*$ susceptibility contrast agent such as a dysprosium chelate or by recording $T_2$- or $T_2^*$-weighted scans using a predominantly positive contrast agent such as a gadolinium chelate.

Kuhl et al. in *Radiology* 202(1), pp. 87–95 (1997) describe use of $T_2^*$-weighted dynamic first-pass perfusion imaging in differentiating benign and malignant breast tumours, with bolus injection of a gadolinium chelate. No perfusion effects were detectable in healthy breast parenchyma, and no or only minor effects were seen in fibroadenomas, whereas a strong susceptibility-mediated signal loss was observed in respect of malignant breast tumours, possibly being the result of increased flow volume and/or increased capillary flow. Conventional $T_1$-weighted dynamic imaging in many instances did not distinguish between malignant tumours and fibroadenomas.

In a review entitled "Concepts of Myocardial Perfusion Imaging in Magnetic Resonance Imaging" in *Magnetic Resonance Quarterly* 10 (4), pp. 249–286 (1994), Wilke et al. record that MR first-pass techniques using gadolinium chelates have been used for qualitative assessment of myocardial perfusion in patients at rest and during pharmacological stress, e.g. induced by administration of dipyridamole, and note that such techniques may be useful in obtaining quantitative information on regional myocardial blood flow and volume. First-pass imaging using gadolinium chelates and $T_1$-weighted imaging sequences, e.g. an ultrafast $T_1$-weighted Turbo-Flash sequence with repetition time (TR) 5.9 ms, echo time (TE) 3 ms and flip angle ($\alpha$) 9–15°, is described. The use of coated iron oxide particles as $T_1$ blood pool agents at small dosages (i.e. low concentrations) and as $T_2^*$ susceptibility agents at higher dosages and concentrations is also discussed but there is no suggestion of first-pass applications of such contrast agents.

A disadvantage of existing first-pass MR techniques using extracellular (and preferably intravascular) gadolinium chelates and fast $T_1$-weighted sequences, e.g. in cardiac perfusion imaging, is that the relatively low contrast effect of such agents may make it difficult unambiguously to identify the first pass of the contrast agent. Whilst this may to some extent be overcome by using $T_2^*$-weighted imaging sequences and extracellular/intravascular gadolinium- or, more preferably, dysprosium-based contrast agents, the loss in time resolution brought about by the inevitable need for longer TEs in $T_2^*$-weighted imaging severely limits the number of image slices which may be obtained, and may lead to significant and unacceptable motion artifacts in cardiac images.

Moreover, existing first-pass methods are not readily compatible with dual testing methods such as are needed to obtain cardiac perfusion data (i) at rest and (ii) during or after stress, since residual contrast agent from the initial bolus injection may swamp the effect of a second bolus injection intended to generate a further first-pass response.

The present invention is based on the finding that effective first pass perfusion imaging may be achieved following bolus injection of a contrast agent which exhibits simultaneous $T_1$ and $T_2^*$ effects under the imaging procedure (including the contrast agent dosage and concentration) employed. Such an agent may accordingly function as both a $T_1$ agent and a $T_2$ agent under similar dosage and imaging conditions as may typically be used for conventional $T_1$ agents and $T_1$-weighted imaging. Thus for a concentrated bolus during its first pass through vasculated tissue, a decrease in signal intensity may be observed due to the short $T_2$ for the concentrated bolus as well as the large additional $T_2^*$ effect arising from confinement of the agent in the extracellular space within the vasculature. Due to the magnetic characteristics of the contrast agent, this signal decrease may be observable in a $T_1$-weighted imaging sequence, giving an indication or measure of the rate of tissue/organ perfusion. Subsequent dilution of the contrast agent throughout the blood pool thereafter reduces the $T_2$, and $T_2^*$ effects, allowing the $T_1$ effect to dominate, thereby resulting in an increase in signal intensity, permitting an overall image of tissue/organs of interest to be obtained. Such use of a $T_1$-weighted imaging sequence to visualise both $T_2^*$ and $T_1$ effects is advantageous in that the short TEs characteristic of $T_1$-weighted imaging ensure maximum time resolution and minimum motion artifact in the resulting images.

Thus according to one aspect of the present invention there is provided a method of contrast agent-enhanced magnetic resonance imaging of perfusion in vasculated tissue within a human or non-human animal body in which a bolus comprising a contrast-enhancing amount of a magnetic resonance imaging contrast agent is administered into the vascular system of said body, and said body is subjected to a magnetic resonance imaging procedure whereby signals or images representative of first pass of said contrast agent bolus through tissue of interest are generated, characterised in that (i) said contrast agent is capable of exhibiting simultaneous, determinable $T_1$ and $T_2^*$ reducing effects under the imaging procedure employed and (ii) a $T_1$-weighted imaging procedure is used (a) to visualise the first pass of said contrast agent bolus through said tissue by virtue of its signal lowering $T_2^*$ effect and (b) to obtain a $T_1$-weighted contrast agent-enhanced image of said tissue.

The method of the invention is particularly suited to cardiac imaging and measurement of myocardial perfusion, but may also be of use in, for example, measurement of renal perfusion and tumour perfusion.

In order to generate the desired balance of $T_1$ and $T_2^*$ effects, the contrast agent desirably has a large magnetic moment (e.g. greater than 1000 Bohr Magnetons, preferably greater than 5000 Bohr Magnetons), and a small $r_2/r_1$ ratio (where $r_1$ and $r_2$ are the $T_1$ and $T_2$ relaxivities respectively), e.g. less than 3, preferably less than 2 (as measured at 0.5 T and 40° C.). The $r_2$ relaxivity should also be relatively high and may advantageously be at least 10 mM$^{-1}$s$^{-1}$, preferably at least 15 mM$^{-1}$s$^{-1}$ (as measured at 0.5 T and 40° C.), where the mM concentration pertains to the total concentration of the metal ion. Contrast agents such as dysprosium chelates are generally unsuitable by virtue of their lack of significant $T_1$ effect, whilst contrast agents such as gadolinium chelates tend to generate inadequate susceptibility effects at normal dosages, magnetic fields etc.

Preferred contrast agents for use in the present method include parenterally administrable superparamagnetic, ferrimagnetic and ferromagnetic particles (hereinafter referred to as "magnetic particles"), for example as described in U.S. Pat. Nos. 4,904,479, 5,160,725, 5,464,696, WO-A-9421240, WO-A-9609840 and WO-A-9725073, the contents of which are incorporated herein by reference.

The use of magnetic particles in the manufacture of contrast agents for use in the method of the invention is itself a further feature of the present invention.

The magnetic particles may advantageously comprise magnetic iron oxide compounds of formula $$(M^{II}O)_n(M_{III}{}^2O_3)$$

(where $M^{II}$ and $M^{III}$ are transition or lanthanide metals in the II and III valence states respectively, at least one of them being Fe, and n is zero or a positive number), preferably of formula $$(M^{II}O)_nFe_2O_3(M^{III}{}_2O_3)_m$$

(where $M^{II}$ is a divalent metal such as Fe, Mg, Be, Mn, Zn, Co, Ba, Sr or Cu; $M^{III}$ is a trivalent metal such as Al, Yb, Y, Mn, Cr or a lanthanide; and n and m are each zero or a positive number). Particularly preferred magnetic particles comprise iron oxides of formula $$(FeO)_nFe_2O_3$$

(where n is in the range 0 to 1), typified by maghemite ($\gamma$-Fe$_2$O$_3$) and magnetite (Fe$_3$O$_4$) or mixtures thereof.

Such magnetic particles generally additionally comprise one or more coating materials such as proteins, lipids, polysaccharides or synthetic polymers, which serve to delay their uptake by the reticuloendothelial system and so prolong their residence time in the blood pool. The use of composite nanoparticles comprising a superparamagnetic iron oxide core provided with an oxidatively cleaved starch coating together with a functionalised polyalkylene oxide, e.g. a methoxy polyethylene glycol phosphate, prepared as described in WO-A-9725073, is particularly preferred. Such agents may conveniently be administered in concentrations of 1 to 75 mg Fe/ml, e.g. 20 to 40 mg Fe/ml, for example to give an overall dosage of 0.05 to 15 mg Fe/kg, such as 0.1 to 8 mg Fe/kg.

Bolus administration will typically involve rapid (e.g. 1–5 second) injection of a 1–10 ml volume of contrast agent solution.

The $T_1$-weighted imaging procedure is preferably a fast or ultrafast method with TE less than 10 ms, preferably less than 5 ms, e.g. 2 or 3 ms. Representative imaging methods include fast and ultrafast gradient-echo sequences and echoplanar imaging.

An advantage of the method of the invention is that it readily lends itself to successive determinations of myocardial perfusion, since the concentration-related $T_2^*$ effect of the first pass of a second bolus injection of contrast agent may, by appropriate choice of bolus concentration etc., be arranged to exceed the $T_1$ effect of contrast agent remaining from a first injection. This accordingly permits repeated perfusion imaging of subjects during rest and during or after physical or pharmacological stress.

The following non-limitative example serves to illustrate the invention.

EXAMPLE

Suspensions of methoxy PEG phosphate-coated magnetic iron oxide particles prepared as described in Example 12 of WO-A-9725073, at dosages of 2.5 and 4 mg Fe/kg, were intravenously injected into the anticubital vein of volunteer patients. The injected volumes and injection rates were in the ranges 2.5–10 ml and 0.5–3 ml/s respectively. All injections were followed by an intravenous flush of 20 ml saline at an injection rate of 2 ml/s.

A 2D slice was positioned at a short axis view of the myocardium. The scan was an RF-spoiled gradient echo with TR/TE/flip 7.7/2.6/15. The field strength was 1.5 T, the slice thickness was 10 mm and the field of view was 400 mm. The resolution was 256×128 with a rectangular field of view of 60% giving 77 phase encoding steps for each image. The scantime for each image was approximately 600 ms. The bandwidth was 299 Hz/pixel. All images were taken using the body coil for transmission and a 17 cm surface coil for receiving. The scan was run as an ECG-triggered dynamic scan giving one image per cardiac cycle, with the number of images varying from 30 to 50; the trigger delay was set to the maximum possible depending on the heart rate of the volunteers, and the scan was started at the same time as injection of the contrast agent. A region of interest was drawn in the myocardium, where the signal intensity was measured for each image.

All injections gave a signal drop during first pass of the contrast agent, the effect being particularly pronounced at the 4 mg/kg dosage. The $T_2^*$ effect could be measured with an echo time as short as 2.6 ms.

What is claimed is:

1. A method of contrast agent-enhanced magnetic resonance imaging of perfusion in vasculated tissue within a human or non-human animal body in which a bolus comprising a contrast-enhancing amount of a magnetic resonance imaging contrast agent is administered into the vascular system of said body, and said body is subjected to a magnetic resonance imaging procedure whereby signals or images representative of first pass of said contrast agent bolus through tissue of interest are generated, characterised in that (i) said contrast agent exhibits simultaneous, determinable $T_1$ and $T_2^*$ reducing effects under the imaging procedure employed and (ii) a $T_1$-weighted imaging procedure is used (a) to visualise the first pass of said contrast agent bolus through said tissue by virtue of its signal lowering $T_2^*$ effect and (b) to obtain a $T_1$-weighted contrast agent-enhanced image of said tissue.

2. A method as claimed in claim 1 wherein said contrast agent has a magnetic moment greater than 1000 Bohr Magnetons.

3. A method as claimed in claim 1 wherein said contrast agent has a magnetic moment greater than 5000 Bohr Magnetons.

4. A method as claimed in claim 1 wherein said contrast agent has a $r_2/r_1$ ratio of less than 3, measured at 0.5 T and 40° C., where $r_1$, and $r_2$ are the $T_1$ and $T_2$ relaxivities respectively.

5. A method as claimed in claim 4 wherein said ratio is less than 2.

6. A method as claimed claim 1 wherein said contrast agent has an r, value of at least 10 $mM^{-1}s^{-1}$, measured at 0.5 T and 40° C., where $r_1$ and $r_2$ are the $T_1$ and $T_2$ relaxivities respectively.

7. A method as claimed in claim 6 wherein said $r_1$ value is at least 15 $mM^{-1} l\, s^{-1}$.

8. A method as claimed in claim 1 wherein said bolus administration involves injection of a 1–10 ml volume of a contrast medium comprising said contrast agent and wherein said injection lasts 1–5 secs.

* * * * *